(12) United States Patent
Wang et al.

(10) Patent No.: US 7,973,283 B2
(45) Date of Patent: Jul. 5, 2011

(54) METHOD FOR REGULATING SCANNING SAMPLE SURFACE CHARGE IN CONTINUOUS AND LEAP-AND-SCAN SCANNING MODE IMAGING PROCESS

(75) Inventors: Joe Wang, Campbell, CA (US); Jack Jau, Los Altos Hills, CA (US)

(73) Assignee: Hermes Microvision, Inc., Hsinchu (TW)

( * ) Notice: Subject to any disclaimer, the term of this patent is extended or adjusted under 35 U.S.C. 154(b) by 476 days.

(21) Appl. No.: 12/232,834

(22) Filed: Sep. 25, 2008

(65) Prior Publication Data

US 2010/0072364 A1    Mar. 25, 2010

(51) Int. Cl.
*G01N 23/00* (2006.01)

(52) U.S. Cl. ........ 250/311; 250/306; 250/307; 250/310; 361/212; 361/213

(58) Field of Classification Search ............... 250/306, 250/307, 310, 311; 361/212, 213
See application file for complete search history.

(56) References Cited

U.S. PATENT DOCUMENTS

| 7,560,939 B1 * | 7/2009 | De et al. .................. 324/754.22 |
| 2002/0130260 A1 * | 9/2002 | McCord et al. ............... 250/306 |
| 2005/0201038 A1 * | 9/2005 | Wang et al. .................. 361/212 |

* cited by examiner

*Primary Examiner* — Robert Kim
*Assistant Examiner* — Michael Maskell
(74) *Attorney, Agent, or Firm* — Rosenberg, Klein & Lee

(57) ABSTRACT

A method for regulating sample surface charge has been proposed in this invention. The processes of applying a charged particle beam to a first area and applying a flood energized beam gun with gaseous molecules to a second area are executed in the method when the sample is in both continuous and Leap & Scan movements. The second area is located at a predetermined distance from the first area behind or ahead of the first area being scanned with respect to the movement of the sample. Thus, the surface of the sample may be regulated.

20 Claims, 3 Drawing Sheets

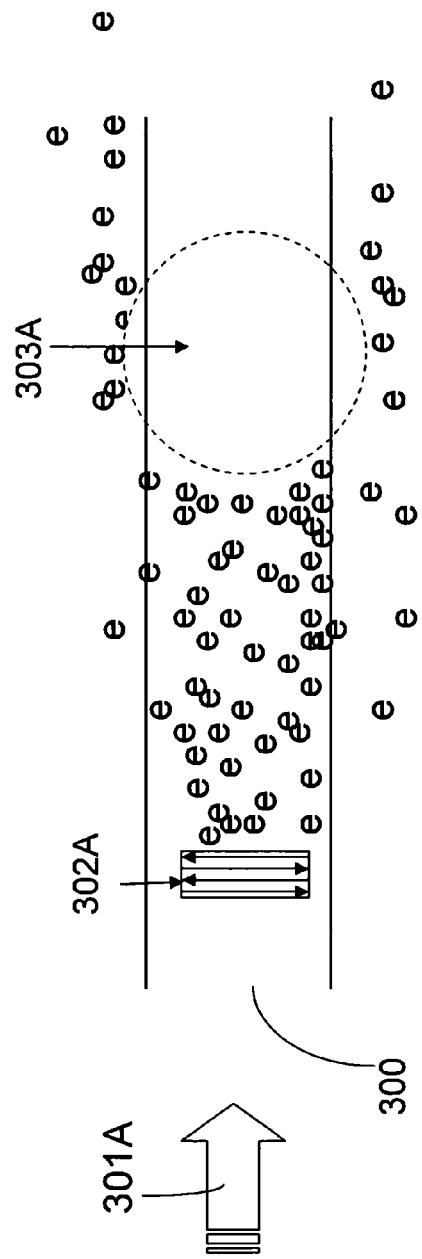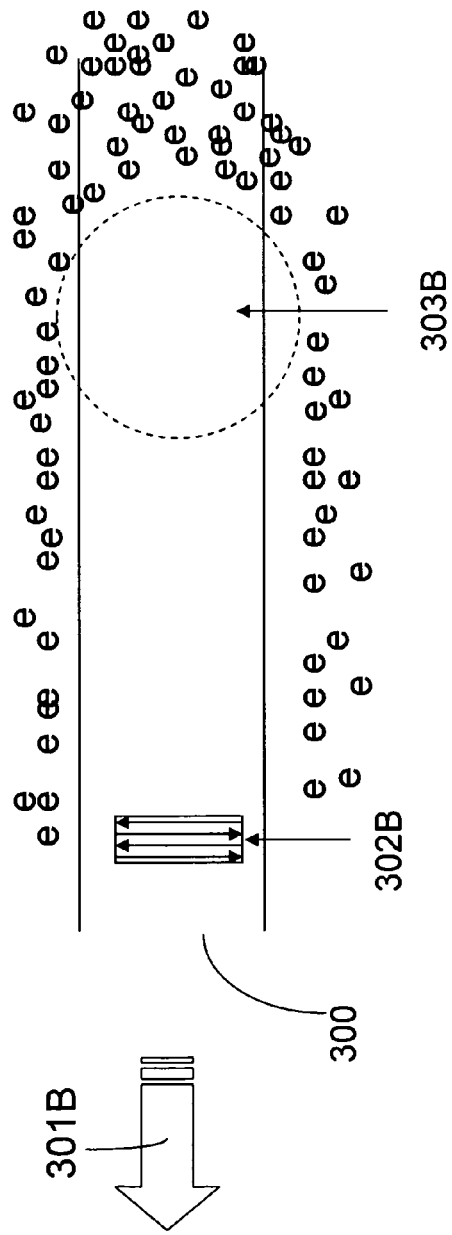

METHOD FOR REGULATING SCANNING SAMPLE SURFACE CHARGE IN CONTINUOUS AND LEAP-AND-SCAN SCANNING MODE IMAGING PROCESS

BACKGROUND OF THE INVENTION

1. Field of the Invention

The present invention relates to a method for regulating scanning sample surface charge regulation during wafer inspection or review.

2. Background of the Related Art

Integrated circuit fabrication process uses various types of techniques, such as etching, deposition, and photolithography. Defects often introduced during those processes. Thus, semiconductor integrated circuit need to be inspected and defect need to be reviewed during the fabrication. Regulation of charging status on wafer surface is often needed for charged particle beam inspection and review tools.

Unbalanced charging on wafer surface can adversely affect subsequent fabrication, inspection or defect review processes. To reduce the adverse effects, a conventional precharging technique has been developed for SEM defect inspection and review. The pre-charging technique uses a flood gun to create strong and equalized charging on a substrate and its associated structure. The charging can reduce or eliminate the non-uniform distribution of electrostatic charges generated prior to and/or during the e-beam inspection or defect review. But the pre-charging technique may result in image distortions in gray scale, reduced image sensitivity and resolution, and time-dependent location-related differences due to non-uniform charge leakage.

Additionally, to reduce the adverse effect on fabrication or inspection processes, some conventional techniques have been developed to remove electrical charges. These conventional techniques include ionizer radiation and ultraviolet (UV) illumination. The ionizer radiation generates ionized air or gas molecules under the primary electron beam to neutralize electrostatic charges on wafer surface. But the ionizer air/gas under the primary electron beam can (1) lower image resolution and (2) hurt the high vacuum environment in primary beam column. Another conventional technique uses UV illumination. However, the irradiated semiconductor substrate often includes grounded conductive traces and the UV illumination technique usually cannot effectively neutralize electric charges far away from conductive traces.

Hence it is highly desirable to improve techniques for removing and neutralizing electrical charges on wafer surface, especially for e-beam wafer/photo mask inspection and defect review tools.

SUMMARY OF THE INVENTION

The present invention is directed to a method for regulating scanning sample surface charge applied to a charged particle beam inspection or defect review assembly. Gaseous molecules are injected under the flood gun charged particle beam, rather than under the primary charged particle beam. This method is particularly important for not impact on the image resolution and the primary beam column vacuum condition.

When a sample is subjected to a continuous movement during inspection, two areas, the primary beam scan area and flood gun gaseous injection area, through which a scan track passes are formed at a predetermined distance from each other for regulating scanning sample surface Accordingly, a method for regulating scanning sample surface charge regulation includes providing a sample in continuous movement along a scan track; applying a charged particle beam to a first scan area, the primary beam scan area, through which the scan track passes; and applying an energized beam with gaseous molecules to a second area, the flood gun gaseous injection area through which the scan track passes. The second area is located at a predetermined distance from the first area, and may be located behind or ahead of the first area being scanned with respect to the movement of the sample. And a charged particle beam inspection assembly and a scanning electron microscope performing the method aforementioned are also provided herein.

When a sample is subjected to a leap and scan movement during inspection or defect review, the flood gun gaseous injection area will cover the inspection or review area first to regulate the surface charge. Then, the primary beam will move to the inspection or review area for imaging. Certainly, the primary beam also can move to the inspection or review area for imaging and remove the surface charging secondly.

These and other aspects, features and advantages of the present invention can be further understood from the accompanying drawings and description of preferred embodiments.

BRIEF DESCRIPTION OF THE DRAWINGS

FIG. 3A is a schematic diagram illustrating the activities that happen on the scan track in accordance with the present invention.

FIG. 3B is a schematic diagram illustrating other activities that happen on the scan track in accordance with the present invention.

DETAILED DESCRIPTION OF THE INVENTION

Figure 1:
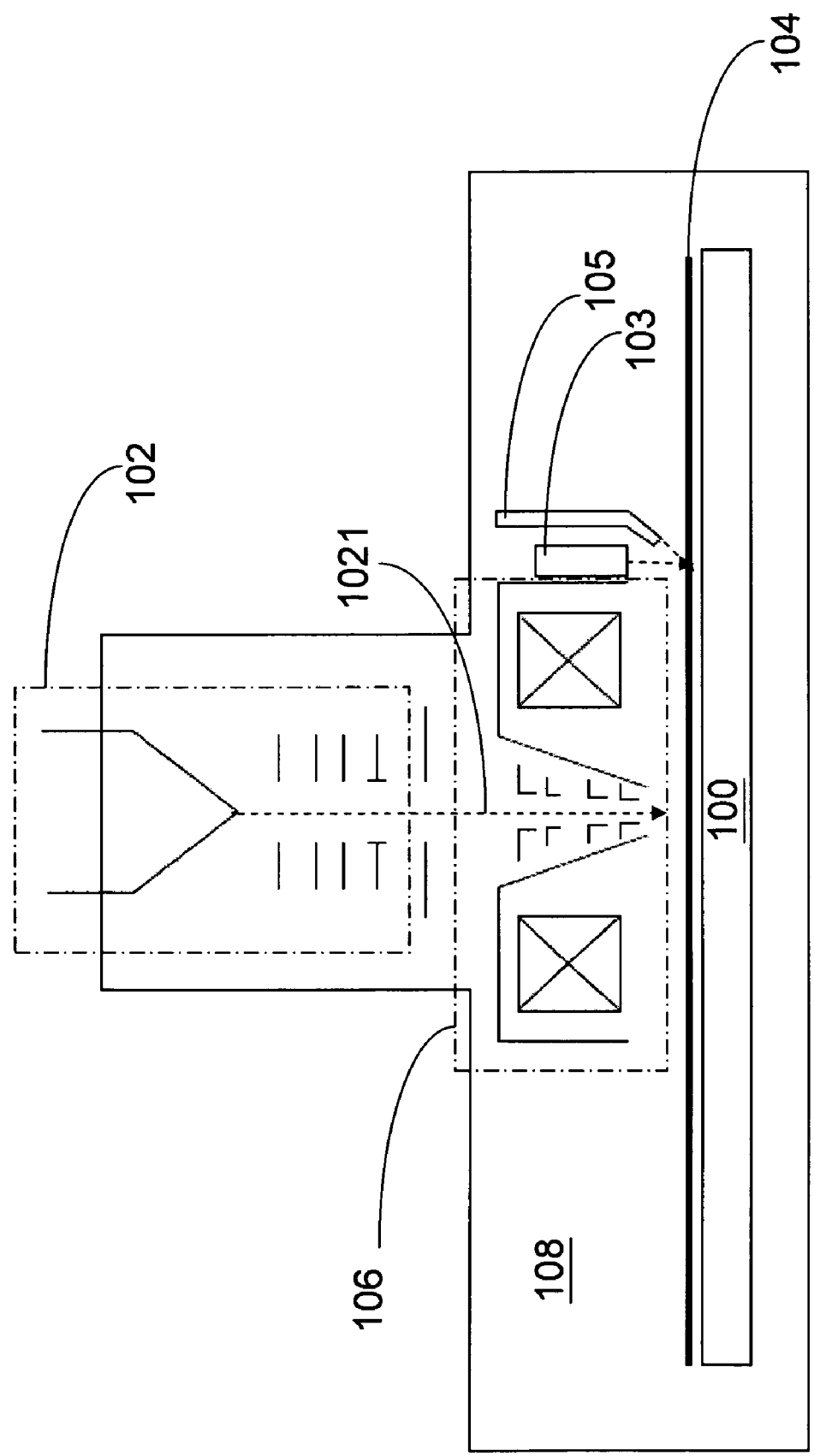
FIG. 1 is a simplified system drawing for removing and neutralizing charge according to an embodiment of the present invention.

FIG. 1 is a simplified system drawing for regulating charges on a scanned sample surface according to an embodiment of the present invention. In one example, a charged particle beam inspection assembly presented in this drawing is capable of regulating surface charge on a sample during charged particle beam inspection or defect review in a vacuum chamber 108. The charged particle beam inspection assembly at least includes a sample holder 100, a primary charged particle beam gun unit 102 and a flood energized beam gun 103. In the embodiment, the flood energized beam gun 103 can either remove the surface charge with the charges of opposite electricity. Alternatively, the flood energized beam gun 103 may intentionally add identical charges to the surface charges to make charge distribution uniform on the surface. An objective lens system 106 is configured for focusing the primary charged particle beam from the gun unit 102 into a focused primary charged particle beam 1021. A gas supplier 105 is configured for generating a gas stream including gaseous molecules under the flood gun 103. The sample 104 is moved along a scan track holding the sample thereon. The sample 104 may be, for example but not limited to, a wafer or a mask. In an example of continuous scan mode operation as according to the present invention, the primary charged particle beam gun of the primary charged particle beam gun unit 102 is configured for applying the primary charged particle beam 1021, for example but not limited to, an electron beam to a first area on the scan track through which the sample 104 would travel during the imaging process.

Figure 2:
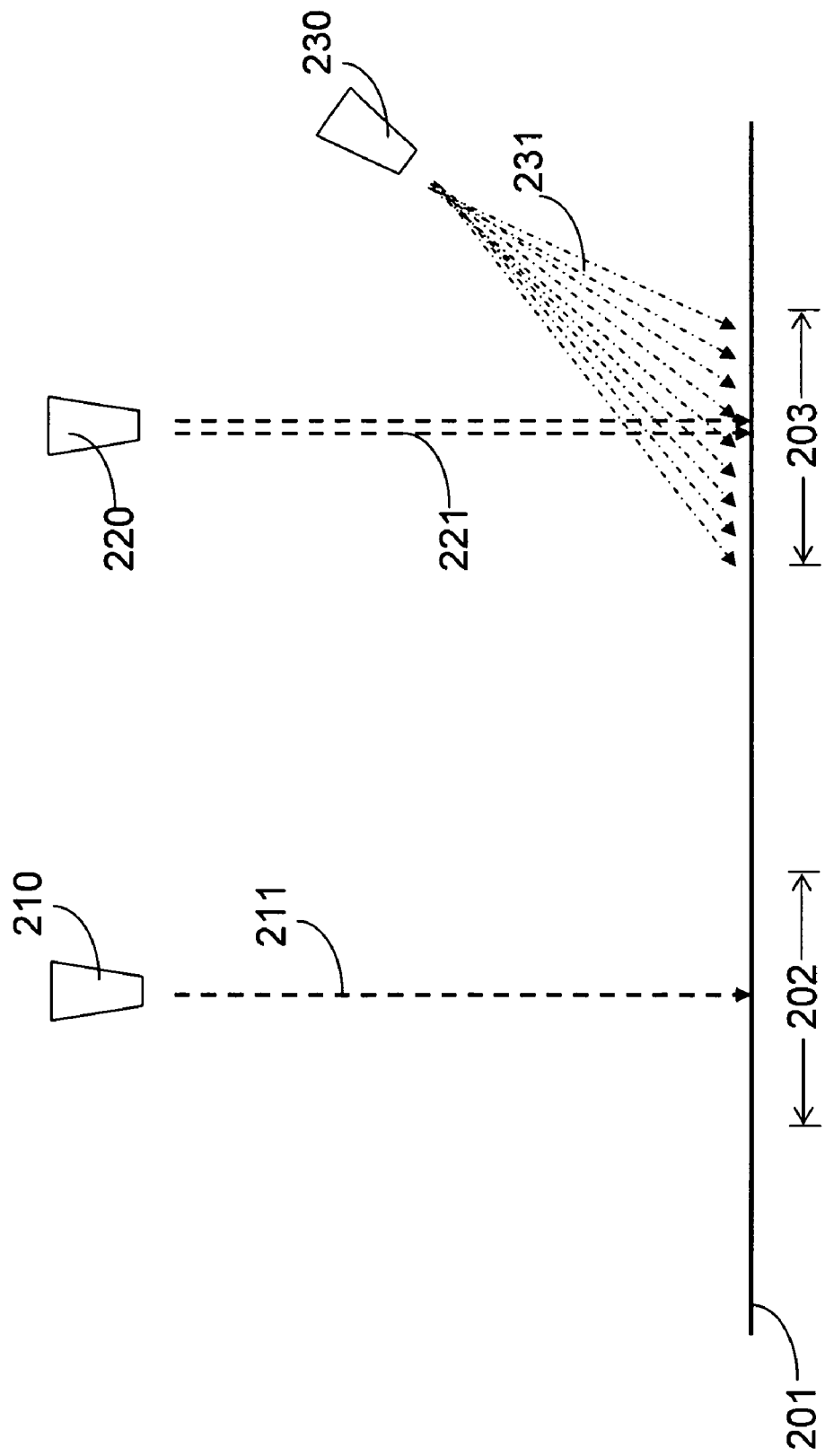
FIG. 2 is a schematic block diagram illustrating the details of present invention.

FIG. 2 is a schematic side-view diagram illustrating the relative locations of the primary charged particle beam gun and the flood energized beam gun during a continuous movement scan mode according to one embodiment of the invention. In one example, a gas supplier 230 is configured for generating a gas stream including gaseous molecules. A flood energized beam gun 220 is configured for ionizing the gaseous molecules from the gas supplier 230 to a second area 203 on a scan track 201. A primary charged particle beam gun 210 emits a primary charged particle beam 211 onto a first area 202 on the scan track 201. The flood energized beam gun 220 emits a flood energized beam 221 onto the second area 203 on the scan track 201. In one preferred example, the primary charged particle beam 211 and the flood energized beam 221 are applied simultaneously to the first area 202 and the second area 203 on the scan track 201. Alternatively, as in another example, the primary charged particle beam 211 and the flood energized beam gun 221 are alternately applied to the first area 202 and the second area 203 on the track 201 of the sample. Furthermore, the gaseous molecules ionized by the flood energized beam gun 220 may carry the charges identical or opposite to the surface charges that would be induced by the scanning of the sample. Accordingly, the flood energized beam gun 220 ionizes the gaseous molecules so as to regulate the surface charge on the second area 203 and the vicinity of the primary charged particle beam 211.

FIG. 3A is a schematic diagram illustrating activities that happen on the scan track, as according to one embodiment of the present invention. In continuous movement inspection mode the movement of the sample stage represented by an arrow 301A is along scan track 300. The primary charged particle beam gun applies a primary charged particle beam to a first area 302A through which the scan track 300 passes, such that the sample is scanned on its surface while passing through the first area 302A when moving along the scan track 300, and a flood energized beam with the injected gaseous molecules clean the charging (represented as "e" in the figure) in a second area 303A through which the scan track 300 passes. In one example, as shown in FIG. 3A, the second area 303A is located at a predetermined distance behind the first area 302A as with respect to the movement of the sample which is opposite to that of the sample stage represented by the arrow 301A. Alternatively, shown in FIG. 3B, the stage is moved as the direction of an arrow 301B opposite to the movement of the sample stage in FIG. 3A. Firstly, a flood energized beam with the injected gaseous molecules clean the charging to a second area 303B through which the scan track 300 passes. Then a primary charged particle beam gun applies a primary charged particle beam to a first area 302B through which the scan track 300 passes. In the embodiment, the second area is located at a predetermined distance from the first area behind or ahead of the first area being scanned with respect to the movement of the sample.

In a leap and scan mode of inspection or defect review, the sample holder/stage is not in continuous movement. The sample moves to one location, stop and scan, then goes to another location to stop and scan. In this mode, the second area can overlap the scan location first to clean up the charges, then the first area will move to the scan location for imaging. Certainly, the process can be just opposite if the sample surface has no charging at early beginning. That is, in such case the first area will be moved to the scan location for imaged first, than the second area is moved to the scan location to clean up the charges accumulated during imaging.

According to one aspect, the primary charged particle beam and the flood energized beam can be applied simultaneously or alternately. In one example, the flood energized beam may be suitable for ionizing the gaseous molecules, for example but not limited to, UV, laser, charged particle beam, and so on. Next, the gaseous molecules ionize upon being bombarded by the energized beam so as to regulate a surface charge that would be induced by the scanning of the sample surface. In this example, the gaseous molecules may be, for example but not limited to, inert gas, air, water, and so on. In the flood energized beam, when the energized beam is applied to the second area, the ionized gaseous molecules may carry identical or opposite charges as the surface charge that would be induced by the scanning of the sample surface.

Although the above has been illustrated using a selected group of processes for the method for charge regulation, there can be many alternatives, modifications, and variations. For example, some of the processes may be expanded and/or combined. Other processes may be inserted to those noted above. Depending upon the embodiment, the sequence of processes may be interchanged with others replaced. Further details of these processes are found throughout the present specification and more particularly below.

Although the present invention has been explained in relation to its preferred embodiment, it is to be understood that other modifications and variation can be made without departing the spirit and scope of the invention as hereafter claimed.

What is claimed is:

1. A method for regulating scanning sample surface charge during charged particle beam imaging, comprising:
   providing a sample, said sample being in continuous movement along a scan track or leap from scan location to the other scan location without along a scan track;
   applying a charged particle beam to a first area, the primary beam scan area, through which said scan track passes, such that said sample is scanned on its surface while passing through said first area when moving along said scan track; and
   applying an energized beam with gaseous molecules to a second area through which said scan track passes, said second area being located at a predetermined distance behind or ahead of said first area being scanned with respect to the movement of said sample,
   wherein said gaseous molecules are ionized upon being bombarded by said energized beam so as to regulate a surface charge that would be induced by the scanning of said sample surface.

2. The method of claim 1, wherein said charged particle beam and said energized beam with said gaseous molecules are applied simultaneously.

3. The method of claim 1, wherein said charged particle beam and said energized beam with said gaseous molecules are applied in alternation.

4. The method of claim 1, wherein said gaseous molecules comprise one selected from the group consisting of the following, or any combination thereof: inert gas, air, water, or other gaseous molecules that can be ionized by an energized beam.

5. The method of claim 1, wherein said energized beam comprises one selected from a group consisting of the following, or any combination thereof: UV, laser, charged particle beam, or other energized beams that can ionize gaseous molecules.

6. The method of claim 1, wherein said ionized gaseous molecules carry identical charge as said surface charge that would be induced by the scanning of said sample surface.

7. The method of claim 1, wherein said ionized gaseous molecules carry opposite charge as said surface charge that would be induced by the scanning of said sample surface.

8. A charged particle beam imaging assembly capable of regulating surface charge on a sample during charged particle beam inspection, comprising:
- a sample holder, said sample holder holds said sample thereon and causes said sample to be in continuous movement along a scan track;
- a charged particle beam gun, said charged particle beam gun applies a charged particle beam to a first area through which said scan track passes, such that said sample is scanned on its surface while passing through said first area when moving along said scan track;
- an energized gun equipped with a gaseous molecules supplier, said energized gun applies an energized beam with gaseous molecules to a second area through which said scan track passes, said second area being located at a predetermined distance behind or ahead of said first area being scanned with respect to the movement of said sample,
- wherein said gaseous molecules are ionized upon being bombarded by said energized beam so as to regulate a surface charge that would be induced by the scanning of said sample surface at said first area.

9. The charged particle beam imaging assembly of claim 8, wherein said charged particle beam and said energized beam with said gaseous molecules are applied simultaneously.

10. The charged particle beam imaging assembly of claim 8, wherein said charged particle beam and said energized beam with said gaseous molecules are applied in alternation.

11. The method charged particle beam imaging assembly of claim 8, wherein said gaseous molecules comprise one selected from the group consisting of the following, or any combination thereof: inert gas, air, water, or other gaseous molecules that can be ionized by an energized beam.

12. The charged particle beam imaging assembly of claim 8, wherein said energized beam comprises one selected from a group consisting of the following, or any combination thereof: UV, laser, charged particle beam, or other energized beams that can ionize gaseous molecules.

13. The charged particle beam imaging assembly of claim 8, wherein said charged particle beam comprises electron beam.

14. The charged particle beam imaging assembly of claim 8, wherein said ionized gaseous molecules carry identical charge as said surface charge that would be induced by the scanning of said sample surface.

15. The charged particle beam imaging assembly of claim 8, wherein said ionized gaseous molecules carry opposite charge as said surface charge that would be induced by the scanning of said sample surface.

16. The charged particle beam imaging assembly of claim 8, wherein said sample comprises a wafer or a mask.

17. A scanning electron microscope comprising:
- an electron beam generator for generating a primary electron beam;
- a condenser lens module for condensing said primary electron beam;
- a probe forming objective lens module for focusing said primary electron beam into an electron beam probe;
- a sample holder for holding a sample thereon and causing said sample to be in continuous movement along a scan track;
- an electron beam deflection module for scanning said electron beam probe across a first area through which said scan track passes, such that said sample is scanned on its surface while passing through said first area when moving along said scan track;
- an energized gun equipped with a gaseous molecules supplier, said energized gun applies an energized beam with gaseous molecules to a second area through which said scan track passes, said second area being located at a predetermined distance behind or ahead of said first area being scanned with respect to the movement of said sample; and
- a charged particle detector module for detecting charged particles generated from said sample when being bombarded by said electron beam probe,
- wherein said gaseous molecules are ionized upon being bombarded by said energized beam so as to regulate a surface charge that would be induced by the scanning of said sample surface at said first area.

18. The scanning electron microscope of claim 17, wherein the application of said charged particle beam to said first area and said energized beam with said gaseous molecules to said second area is selectively to be simultaneous or in alternation.

19. The scanning electron microscope of claim 17, wherein said ionized gaseous molecules carry identical charge as said surface charge that would be induced by the scanning of said sample surface.

20. The scanning electron microscope of claim 17, wherein said ionized gaseous molecules carry opposite charge as said surface charge that would be induced by the scanning of said sample surface.

* * * * *